United States Patent
Vilas Boas et al.

(10) Patent No.: US 8,779,790 B2
(45) Date of Patent: Jul. 15, 2014

(54) PROBING STRUCTURE FOR EVALUATION OF SLOW SLEW-RATE SQUARE WAVE SIGNALS IN LOW POWER CIRCUITS

(75) Inventors: Andre Luis L. Vilas Boas, São Paulo (BR); Fabio Duarte de Martin, São Paulo (BR); Alfredo Olmos, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1163 days.

(21) Appl. No.: 12/492,531

(22) Filed: Jun. 26, 2009

(65) Prior Publication Data

US 2010/0327893 A1 Dec. 30, 2010

(51) Int. Cl.
*G01R 31/02* (2006.01)
*G01R 31/28* (2006.01)
*G01R 31/317* (2006.01)
*G01R 31/319* (2006.01)

(52) U.S. Cl.
CPC ...... *G01R 31/2884* (2013.01); *G01R 31/31701* (2013.01); *G01R 31/31926* (2013.01); *G01R 31/2855* (2013.01)
USPC ..................... 324/754.07; 714/724

(58) Field of Classification Search
None
See application file for complete search history.

(56) References Cited

U.S. PATENT DOCUMENTS

| | | | | |
|---|---|---|---|---|
| 5,457,400 | A * | 10/1995 | Ahmad et al. | 324/750.3 |
| 5,734,661 | A * | 3/1998 | Roberts et al. | 714/733 |
| 5,896,040 | A * | 4/1999 | Brannigan et al. | 324/750.3 |
| 6,844,751 | B2 * | 1/2005 | Marshall et al. | 324/754.03 |
| 6,937,047 | B2 | 8/2005 | Tran et al. | |
| 7,061,263 | B1 * | 6/2006 | Ong | 324/750.3 |
| 7,262,617 | B2 | 8/2007 | Komatsu et al. | |
| 7,772,867 | B2 * | 8/2010 | Guldi et al. | 324/762.05 |
| 2002/0047724 | A1 * | 4/2002 | Marshall et al. | 324/765 |
| 2004/0177298 | A1 * | 9/2004 | Farnworth et al. | 714/724 |
| 2005/0136558 | A1 * | 6/2005 | Wang et al. | 438/5 |
| 2005/0280434 | A1 * | 12/2005 | Whetsel | 324/765 |
| 2009/0134901 | A1 * | 5/2009 | Chen et al. | 324/765 |
| 2011/0241713 | A1 * | 10/2011 | Duarte De Martin et al. | 324/755.01 |

* cited by examiner

*Primary Examiner* — Jermele M Hollington
(74) *Attorney, Agent, or Firm* — Terrile, Cannatti, Chambers & Holland, LLP; Michael Rocco Cannatti

(57) ABSTRACT

An integrated circuit probing structure (40) is provided for evaluating functional circuitry (42), such as a slow slew-rate square wave signal from a low power circuit, where the probing structure includes two or more probe pads (48, 49) for testing the functional circuitry which are formed to be electrically separate from one another, and a probe test circuit (46) connected to the functional circuitry (42) for conveying a signal from the functional circuitry to a probe needle (47) only when the probe needle (47) electrically connects the two or more probe pads (48, 49).

20 Claims, 6 Drawing Sheets

PROBING STRUCTURE FOR EVALUATION OF SLOW SLEW-RATE SQUARE WAVE SIGNALS IN LOW POWER CIRCUITS

BACKGROUND OF THE INVENTION

1. Field of the Invention

The present invention is directed in general to testing of electronic devices. In one aspect, the present invention relates to integrated circuit testing.

2. Description of the Related Art

In integrated circuit manufacturing, the functionality of the integrated circuit devices is typically tested before completing component assembly by using a conduction or probe test. A typical probe test is conducted by pressing a probe (e.g., lead, prod, contact or needle) against a probe test device of the integrated circuit device under test (DUT) to allow electronic test equipment to test the operation of the DUT. In this way, each integrated circuit die of a semiconductor wafer can be tested to determine if the operational characteristics for the die are within specified limits. However, conventional probe test devices can fail to detect device failures with sensitive circuits, or can alter or impair the performance of such sensitive circuits.

Accordingly, there is a need for an improved system and methodology for performing probe tests of an integrated circuit die to address various problems in the art that have been discovered by the above-named inventors. Various limitations and disadvantages of conventional solutions and technologies will become apparent to one of skill in the art after reviewing the remainder of the present application with reference to the drawings and detailed description which follow, though it should be understood that this description of the limitations and disadvantages is not intended to serve as an admission that the limitations and disadvantages are known.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

A probe test circuit, system, and methodology are described for use in manufacturing and testing an integrated circuit by forming the probe test circuit so that it is only completed and operational when the probe pin is applied to the probe test circuit. The probe test circuit may be formed as a CMOS inverter circuit having two electrically separated probe test points which are only connected to form an inverter output when the probe pin is applied to connect the separated probe test points. In selected embodiments, the CMOS inverter circuit includes PMOS and NMOS transistor devices which are both controlled or gated by the test input signal, where the PMOS transistor device is source/drain connected between a first reference voltage and a first probe test point, and where the NMOS transistor device is drain/source connected between a second probe test point and a second reference voltage. So long as the first and second probe test points are electrically separated or disconnected, no current flow through the PMOS and NMOS transistor devices since they are inactive. However, when a probe pin is applied that electrically connects the PMOS and NMOS transistor devices, the probe test circuit is activated to invert the applied test input signal for use in conducting the probe test. The disclosed probe test circuit and methodology is well suited for use with testing sensitive circuits, such very low power oscillator circuits which generate slow slew-rate square waves, since any power consumption by the probe test circuit occurs only during probe test events.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in simplified schematic diagram form, rather than in detail, in order to avoid limiting or obscuring the present invention. Such descriptions and representations are used by those skilled in the art to describe and convey the substance of their work to others skilled in the art. Various illustrative embodiments of the present invention will now be described in detail below with reference to the figures.

Figure 1:
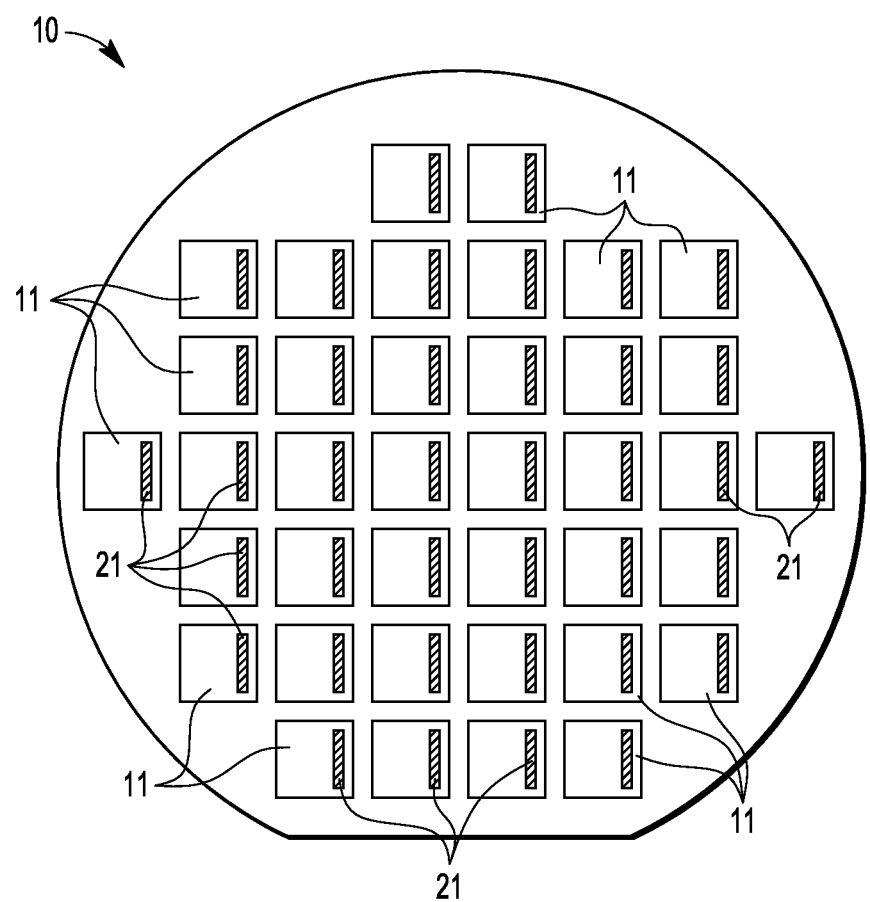
FIG. 1 is a plan view showing a wafer according a preferred embodiment of the present invention.
Figure 2:
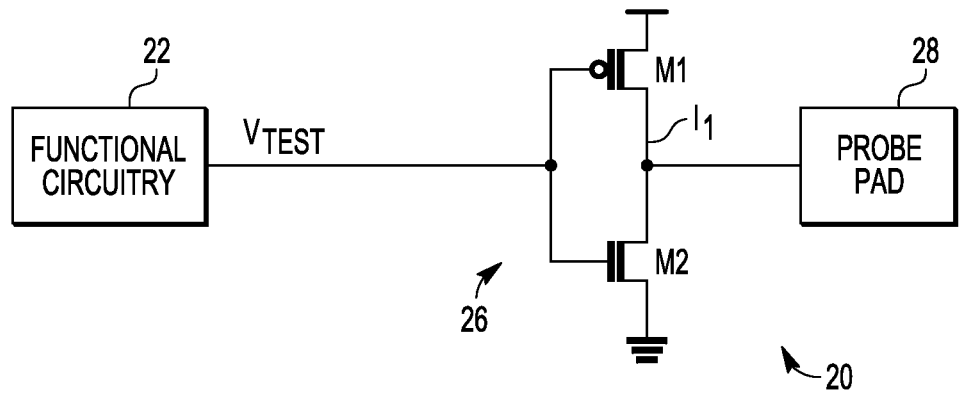
FIG. 2 is a simplified circuit schematic diagram of a first probe test circuit which uses an inverter and probe pad to test functional circuitry.

As shown in FIG. 1, a wafer 10 includes a plurality of integrated circuit die regions 11 which form integrated circuit chips when the wafer is divided. Though not shown, semiconductor features, wiring patterns and bonding pads are formed in the integrated circuit die regions 11. In addition, each integrated circuit die region includes a probe test circuit 21, though these test circuits may be located outside the integrated circuit die regions 11. As will be appreciated, each probe test circuit 21 may include one or more separate test circuits for testing different circuits in the integrated circuit die region 11, such as memory or logic circuits, such as a block or array of memory cells. For example, reference is now made to FIG. 2 which depicts a simplified circuit schematic diagram of a first probe test circuit 20 which uses an inverter 26 and probe pad 28 to test functional circuitry 22. As disclosed, the probe/test pad 28 is used to test the functional circuitry 22 by electrically coupling the probe/test pad 28 to the functional circuitry through an input/output (I/O) buffer 26 which may be implemented as a CMOS inverter circuit 130 in which a PMOS transistor M1 and NMOS transistor M2 are connected in series between first and second reference voltages (e.g., Vdd and ground), with the output of the CMOS inverter 26 being electrically coupled to the probe/test pad 28. During testing, test data may be generated by functional circuitry block(s) 22 and driven by the I/O buffer/inverter circuit 26 so that the output signal may be picked up at the probe/test pad 28 by a probe pin of a testing apparatus that is brought into contact with the probe/test pad 28. With this test configuration, the functional circuitry block(s) 22 can be tested without any contact to the bond pad(s), thereby avoiding any damage to the same. As will be appreciated, a single functional circuitry block is illustrated, but additional functional circuitry blocks and/or bond pads may also be included and/or multiplexed for connection to the input of the I/O buffer/inverter circuit 26.

Figure 3:
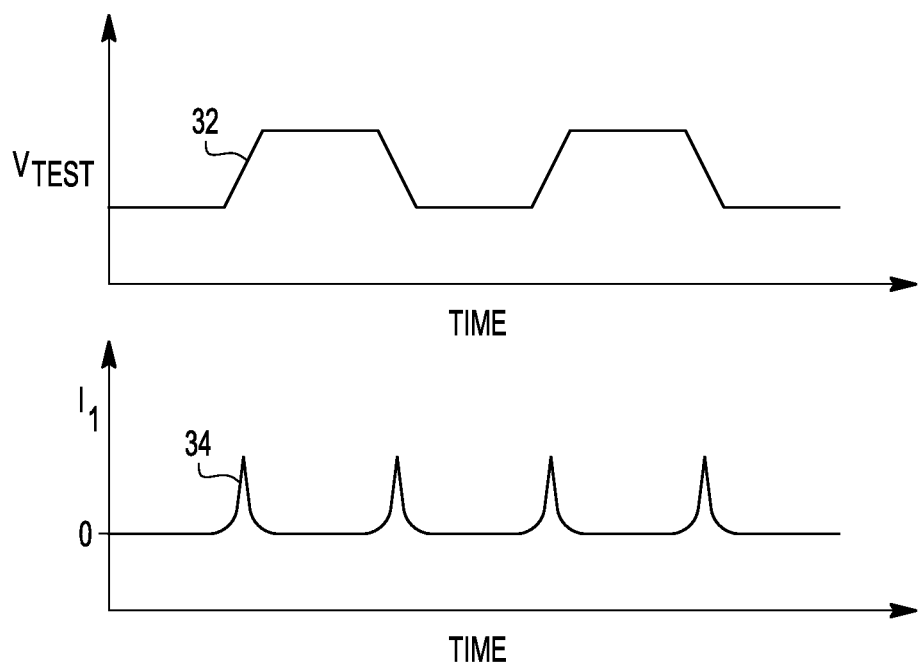
FIG. 3 depicts a simulation plot of the input test voltage and resulting current flow for the first probe test circuit shown in FIG. 1.

While the probe test circuit 20 can be used as a probe test device for different integrated circuit DUTs or functional blocks, there are some circuits or functional blocks which can be adversely affected by the operation of the probe test circuit 20. For example, if the functional circuitry 22 were a very-low-power (VLP) oscillator that consumes very low current (e.g., less than 1 uA), the square wave output generated by the oscillator for test (Vtest) could be buffered or driven by the I/O buffer/inverter circuit 26. However, because the square wave output generated by the VLP oscillator has a slow slew rate (as illustrated in FIG. 3 with signal waveform 32), each toggle in the test signal (Vtest) generates a large current glitch in both the PMOS and the NMOS devices M1, M2 of the inverter circuit 26 (as illustrated in FIG. 3 with signal waveform 34). This is shown with the simulation plot of the input test voltage and resulting current flow in FIG. 3, where each transition in the slow slew rate output from the VLP oscillator (Vtest) creates a glitch in the output current $I_1$ at the output of the inverter circuit 26. The higher the slew rate, the shorter the glitches in the output current $I_1$, and the lower the slew rate, the higher the glitches in the output current $I_1$. Thus, while a simple inverter/buffer 26 might be an attractive probe test device, a low slew-rate input test signal can cause the inverter/buffer 26 to consume more current than the VLP oscillator itself To address these concerns, a probe test circuit is provided which uses a buffer, inverter or driver circuit that it is only completed and operational when the probe pin is applied to the probe test circuit. In accordance with selected embodiments of the invention shown in the simplified circuit schematic diagram of FIG. 4, a probe test circuit 40 is provided which uses separated probe pads 48, 49 to complete an inverter circuit 46 for testing functional circuitry 42 only when a probe 47 is applied to connect the separated probe pads 48, 49. As illustrated, the functional circuitry 42 being tested generates an output signal which is to be evaluated, measured or tested (Vtest). In the probe test circuit 40, the output test signal is electrically coupled to the gates or control terminals of PMOS transistor M3 and NMOS transistor M4. The PMOS and NMOS transistors M3, M4 are not connected together in the circuit. Instead, the PMOS transistor M3 is source/drain coupled between a first reference voltage (e.g., Vdd) and a first probe pad 48, while the NMOS transistor M4 is drain/source coupled between a second probe pad 49 and a second reference voltage (e.g., ground). Because the first and second probes pads 48, 49 are not electrically connected together as part of the actual test circuitry, there is no current flow $I_2$ between the PMOS and NMOS transistors M3, M4, except when the probe 47 is applied to connect the separated probe pads 48, 49. However, when the probe 47 is applied to touch and connect the probe pads 48, 49, an electrical connection path is established between the PMOS transistor M3 and NMOS transistor M4. In this way, test data may be generated by functional circuitry block(s) 42 and driven by the I/O buffer/inverter circuit 46 so that the output signal may be picked up by the probe pin 47 of a testing apparatus that is brought into contact with the probe/test pads 48, 49. Otherwise, the drains of both the PMOS and NMOS transistors M3, M4 are floating.

Figure 4:
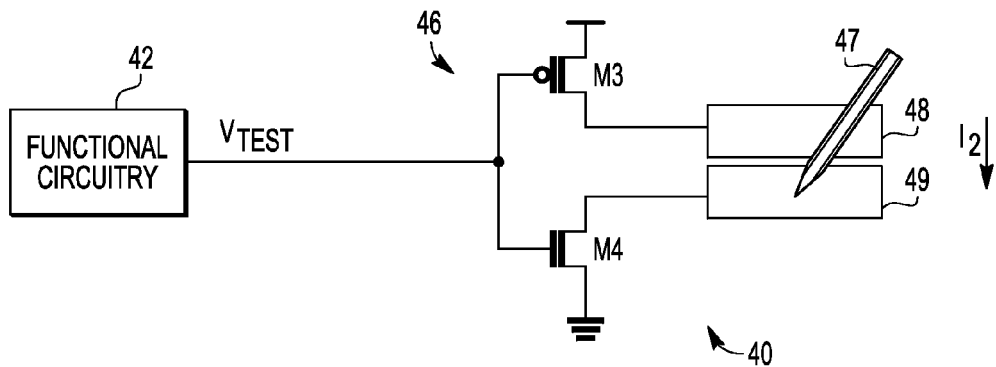
FIG. 4 is a simplified circuit schematic diagram of a second probe test circuit which uses separated probe pads to complete an inverter circuit for testing functional circuitry only when a probe is applied.
Figure 5:
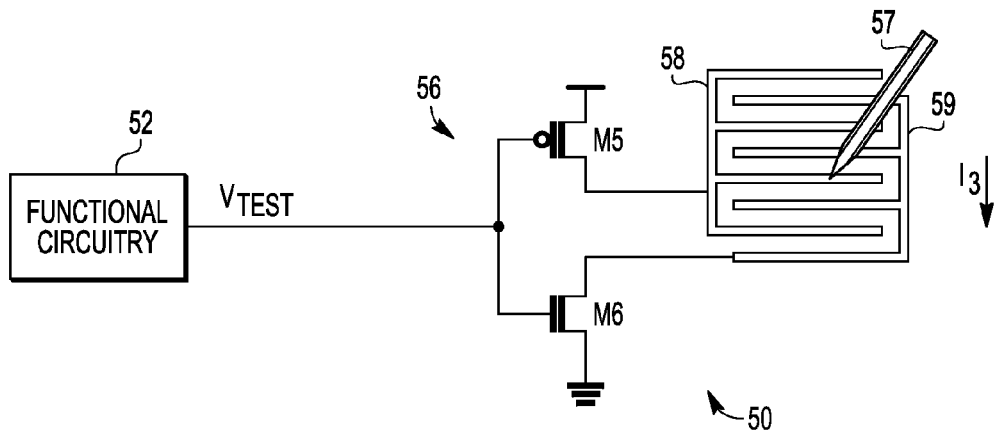
FIG. 5 is a simplified circuit schematic diagram of a third probe test circuit which uses interlaced probe pads to complete an inverter circuit for testing functional circuitry only when a probe is applied.

While the probe/test pads 48, 49 shown in FIG. 4 are formed as simple polygon-shaped pads, such as squares or rectangles, it will be appreciate that other shapes can be used for the probe/test pads. For example, FIG. 5 illustrates a simplified circuit schematic diagram of a third probe test circuit 50 which uses separate interlaced probe pads 58, 59 to complete an inverter circuit 56 for testing functional circuitry 52 only when a probe 57 is applied to connect the separated interlaced probe pads 58, 59. Again, the functional circuitry 52 generates an output test signal (Vtest) which is electrically coupled to the gates or control terminals of PMOS transistor M5 and NMOS transistor M6, where the PMOS transistor M5 is source/drain coupled between a first reference voltage (e.g., Vdd) and a first interlaced probe pad 58, and the NMOS transistor M6 is drain/source coupled between a second interlaced probe pad 59 and a second reference voltage (e.g., ground). Because the first and second interlaced probes pads 58, 59 are not electrically connected together as part of the actual test circuitry, there is no current flow $I_3$ between the PMOS and NMOS transistors M5, M6, except when the probe 57 is applied to connect the separated interlaced probe pads 58, 59. However, by forming the interlaced probe pads 58, 59 to have multiple fingers of conductive material, the probe 57 may be easily applied to touch and connect the interlaced probe pads 58, 59.

Figure 6:
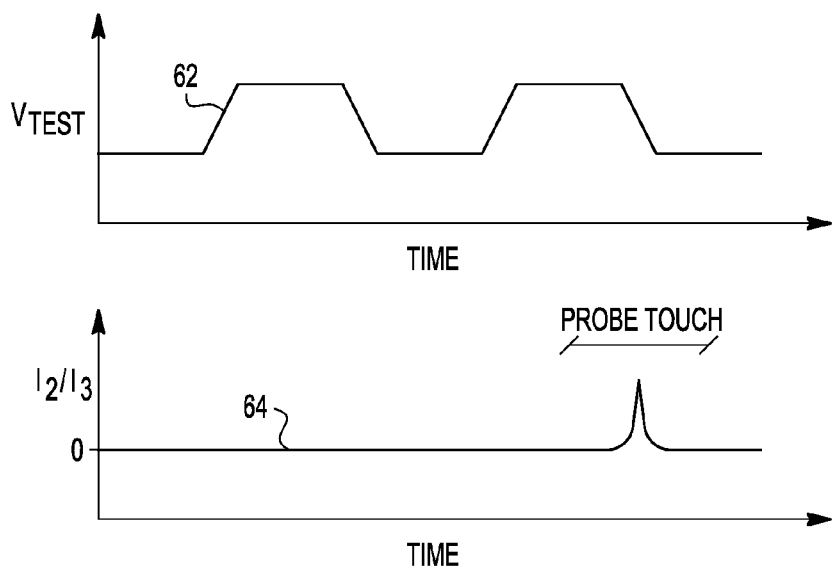
FIG. 6 depicts a simulation plot of the input test voltage and resulting current flow for the second or third probe test circuits shown in FIGS. 4 and 5.

The foregoing configurations allow testing of sensitive functional circuitry 42/52, such as a very-low-power oscillator that generates a low slew rate square wave output (Vtest), by buffering or driving the I/O buffer/inverter circuit 46/56 only when completed by the probe pin 47/57. With this approach, toggles in the square wave output generated by the functional circuitry 42/52 (as illustrated in FIG. 6 with signal waveform 62) will only generate large current glitches in the output current $I_2$ or $I_3$ at the output of the inverter circuit 46/56 formed by connected PMOS and the NMOS devices M3/M5, M4/M6 when the probe 47/57 is touching and connecting the probe pads 48/58, 49/59 (as illustrated in FIG. 6 with signal waveform 64). This is shown with the simulation plot of the input test voltage and resulting current flow in FIG. 6, where the transitions in the output from the VLP oscillator (Vtest) only creates a glitch in the output current $I_2$ when the probe 47 is touching and connecting the probe pads 48, 49.

As described herein, the disclosed probe test circuit configuration operates as a CMOS inverter circuit only when the probe pin is applied to electrically connect the separate probe/ test pads. This CMOS inverter configuration is well suited for evaluating a weak digital signal coming from a low power circuit. For example, a nanoamp crystal oscillator circuit generates a weak signal since it has a low current drive capability that is not able to drive by itself a needle for a probe test. In addition, the disclosed CMOS inverter configuration is well suited for testing a digital signal that has slow transition times (where the signal rises from "0" to "1" and falls from "1" to "0" logic states) which create a relatively long period of time where both the PMOS and NMOS transistors are turned "ON," thereby creating current glitches which consume significant power. This current consumption is eliminated by the disclosed probe test circuit by activating the CMOS inverter circuit only when the probe needle touches both microprobe pads to close the CMOS inverter circuit. As a result, the current glitches are only generated during the probe test procedures which are intended to be performed at the fab while characterizing, adjusting or tweaking the performance of the functional circuitry under test.

Figure 7:
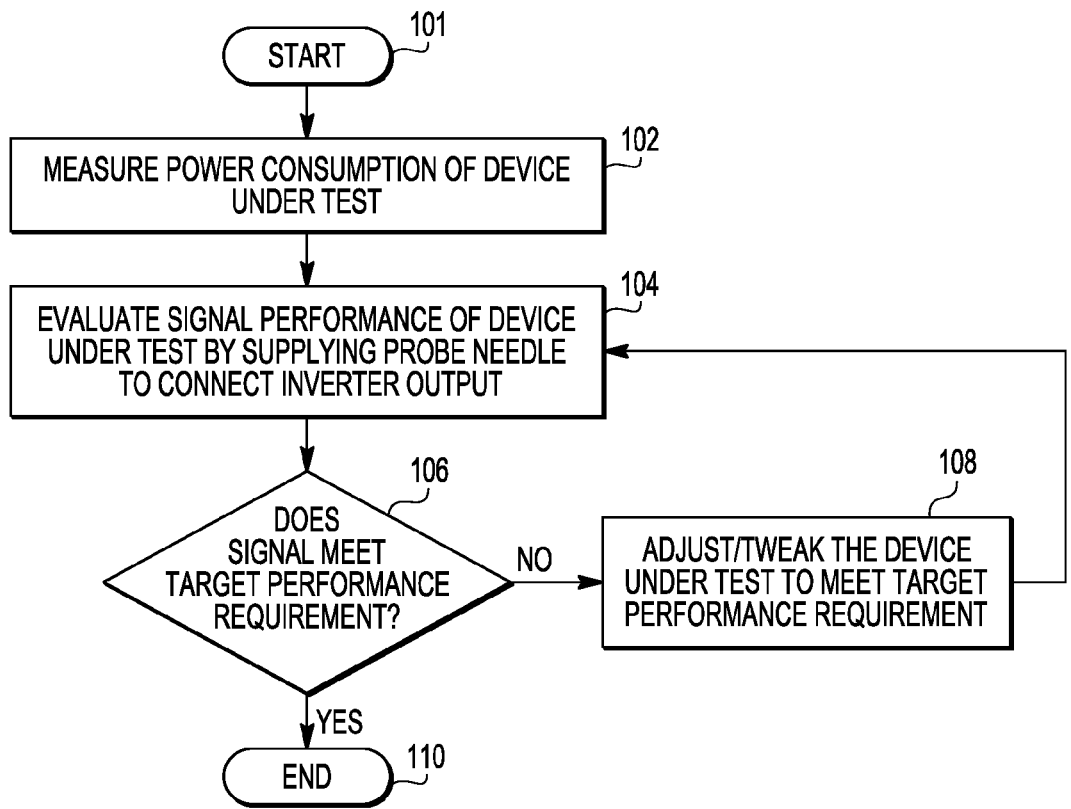
FIG. 7 depicts an example flow sequence for using a probe test circuit to characterize the performance of a functional circuit.

FIG. 7 depicts an example test procedure sequence for using a probe test circuit to characterize and adjust the performance of a functional circuit. Once the probe test sequence starts (step 101), the power consumption of the device under test (e.g., a very low power crystal oscillator) is measured (step 102). Next, the signal performance of device under test is evaluated (step 104) by applying probe needle to connect inverter output and looking at the inverter output (i.e., the signal at the needle). If the signal generated by the device under test does not meet the target or specified performance requirements (negative outcome to decision step 106), the device under test is adjusted or tweaked to meet the target performance requirements (step 108), and the device under test is then re-evaluated (steps 104 and 106) until the signal is within target spec (affirmative outcome to decision step 106), at which point the test procedure sequence ends (step 110). Once the performance of the device under test is adjusted or tweaked into compliance, the probe test circuit need not be used anymore.

While well suited for evaluating weak digital signals, selected embodiments of the CMOS inverter configuration may also be used to measure or test weak analog signals. For example, a probe test circuit can be used to test or measure an analog signal from a functional circuit that has a very low current drive capability or a signal at a high impedance node. Such signals can not be directly measured or evaluated because any coupling with external circuitry (needle, I/O pad, etc.) will destroy the signal integrity and/or force the main circuit out of operation or bias point. For example, if a scope is applied to a high impedance node through a probe needle, the input impedance of the scope (e.g., on the order of 10-20 MOhms) will drastically change the DC level at the high impedance node under test. In addition, the analog signal will be attenuated and/or distorted by the measurement equipment.

To address these concerns, a probe test circuit is provided which selectively applies two microprobes or needles to a buffer, inverter or driver circuit that it is only completed and operational when the probe pins are applied to the probe test circuit. In accordance with selected embodiments of the invention shown in the simplified circuit schematic diagram of FIG. 8, a probe test circuit 70 is provided with a source follower circuit which is configured as a PMOS level shifter to shift a weak analog test signal up for testing or measuring the analog test signal. As illustrated, the analog signal from the functional circuitry (not shown) being evaluated, measured or tested is provided as an input voltage (Vin) to the probe test circuit 70 where it is electrically coupled to the gates or control terminals of PMOS transistor M7 and NMOS transistor M8. The PMOS and NMOS transistors M7, M8 are constructed as floating transistors by connecting their respective sources to source probe pads 72, 71 and by connecting their respective drains to drain probe pads 73, 74, where the source and drain probe pads 71-74 are formed to be electrically isolated or separated from one another. In particular, the PMOS transistor M7 is source/drain coupled between a first probe pad 72 and a second probe pad 73, while the NMOS transistor M8 is drain/source coupled between a third probe pad 74 and a fourth probe pad 71. The probe circuit 70 is activated as a PMOS source follower by applying two microprobes or needles 76, 77 to selectively connect the separate probe pads 72-73. The first needle 77 connects the source terminal of the PMOS transistor M7 to an external current source 78 which is tied to VDD, whereas the second needle 76 connects the drain terminal of the PMOS transistor M7 to a reference voltage pad 75 (e.g., GND). By selectively applying the needles 76, 77 to connect the PMOS transistor M7 into a PMOS source follower circuit, the probe test circuit 70 can be configured as a PMOS level shifter so that an input voltage (Vin) having a low DC level that is close to ground can be shifted up and measured or tested as a shifted output signal (Vout).

Figure 9:
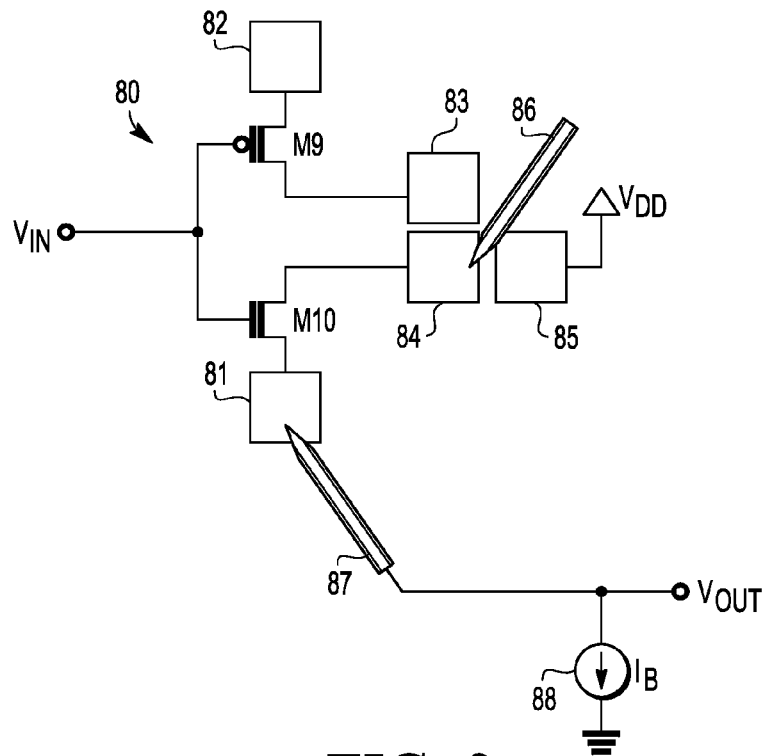
FIG. 9 is a simplified circuit schematic diagram of a probe test circuit with a source follower circuit which is configured as a NMOS level shifter to shift a weak analog test signal down for testing or measuring.

In selected embodiments, the probe test circuit may also be configured to shift an input signal down for testing or measuring, as shown in the simplified circuit schematic diagram of FIG. 9 which illustrates a probe test circuit 80 with a source follower circuit which is configured as an NMOS level shifter. As illustrated, the analog input signal being evaluated, measured or tested (Vin) is provided as an input voltage to the probe test circuit 80 where it is electrically coupled to the gates or control terminals of PMOS transistor M9 and NMOS transistor M10. The PMOS and NMOS transistors M9, M10 are constructed as floating transistors by connecting their respective sources to source probe pads 82, 81 and by connecting their respective drains to drain probe pads 83, 84, where the probe pads 81-84 are formed to be electrically isolated or separated from one another. In particular, the PMOS transistor M9 is source/drain coupled between a first probe pad 82 and a second probe pad 83, while the NMOS transistor M10 is drain/source coupled between a third probe pad 84 and a fourth probe pad 81. The probe circuit 80 is activated as an NMOS source follower by applying two microprobes or needles 86, 87 to selectively connect the separate probe pads 81-84. The first needle 87 connects the probe pad 81 at the source terminal of the NMOS transistor M10 to an external current source 88 which is tied to ground, whereas the second needle 86 connects the probe pad 84 at the drain terminal of the NMOS transistor M10 to a reference voltage pad 85 (e.g., $V_{DD}$). By selectively applying the needles 86, 87 to connect the NMOS transistor M10 into an NMOS source follower circuit, the probe test circuit 80 can be configured as an NMOS level shifter so that an input voltage (Vin) having a high DC level that is close to the power supply can be shifted down and measured or tested as a shifted output signal (Vout).

Figure 8:
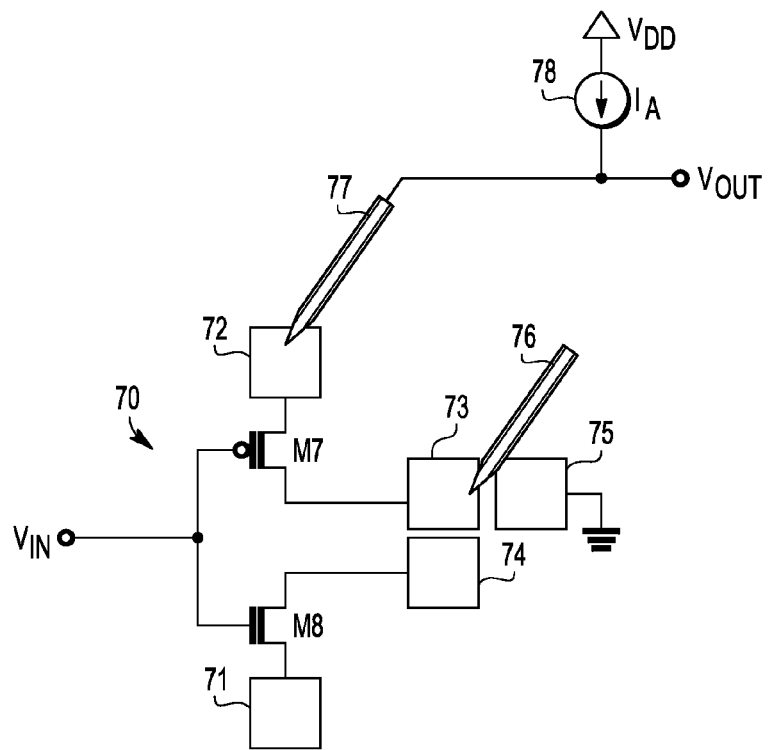
FIG. 8 is a simplified circuit schematic diagram of a probe test circuit with a source follower circuit which is configured as a PMOS level shifter to shift a weak analog test signal up for testing or measuring.
Figure 10:
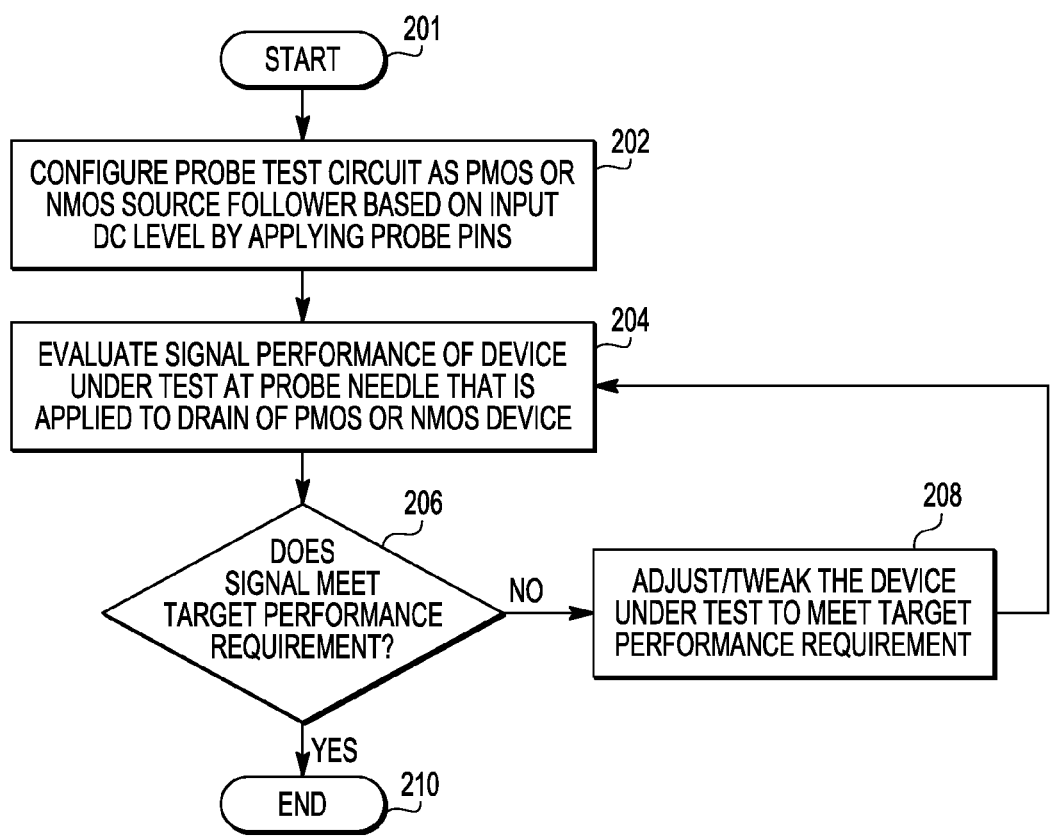
FIG. 10 depicts an example test procedure sequence for configuring a probe test circuit as a PMOS or NMOS source follower to characterize and adjust the performance of an analog signal from a functional circuit.

Reference is now made to FIG. 10 which depicts an example test procedure sequence for configuring a probe test circuit as a PMOS or NMOS source follower to characterize and adjust the performance of an analog signal from a functional circuit, such as a low power oscillator. Once the probe test sequence starts (step 201), the probe test circuit is configured as either a PMOS source follower or NMOS source follower based on the input DC level of the analog input signal (step 202). If the analog signal DC level is low (e.g., close to ground), the probe test circuit is configured as a PMOS level shifter to shift the input signal up by applying the probe pins to the source and drain of the PMOS transistor, such as shown in FIG. 8. On the other hand, if the analog signal DC level is high (e.g., close to the power supply), the probe test circuit is configured as an NMOS level shifter to shift the input signal down by applying the probe pins to the source and drain of the NMOS transistor, such as shown in FIG. 9. In this way, the analog input signal is passed through a source follower (NMOS or PMOS), depending the DC level of the analog input signal. Next, the signal performance of device under test is evaluated (step 204) by applying a first needle to connect the source of the NMOS (or PMOS) device to ground (or Vdd), and applying a probe needle to connect the drain of the NMOS (or PMOS) device to Vdd (or ground) and looking at the signal at the probe needle. Depending on the configuration, the analog input signal will appear at the drain terminal of the NMOS (PMOS) transistor. If the signal generated by the device under test does not meet the target or specified performance requirements (negative outcome to decision step 206), the device under test is adjusted or tweaked to meet the target performance requirements (step 208). To this end, the external bias current can be adjusted to provide enough gain at the source follower. The device under test is then re-evaluated (steps 204 and 206) until the signal is within target spec (affirmative outcome to decision step 206), at which point the test procedure sequence ends (step 210). Again, once the performance of the device under test is adjusted or tweaked into compliance, the probe test circuit need not be used anymore.

By now it should be appreciated that there has been provided an integrated circuit probing structure and methodology for evaluating functional circuitry. As disclosed, the integrated circuit includes functional circuitry (e.g., a low power oscillator circuit or other type of circuit) that may have associated therewith one or more bond pads. The integrated circuit also includes two or more probe pads for testing the functional circuitry which are formed to be electrically separate or isolated from one another. In selected embodiments, the probe pads may be formed as first and second polygon-shaped pads which are formed to be electrically separate from one another, while in other embodiments, the probe pads may be formed as first and second multi-pronged pads which are formed to be interleaved with one another and electrically separate from one another. A probe test circuit is also provided that is connected to the functional circuitry for conveying a signal from the functional circuitry to a probe needle only when the probe needle electrically connects the two or more probe pads so that the probe test circuit consumes no power except when the probe needle electrically connects the probe pads. In selected embodiments, the probe test circuit may be formed from a plurality of switching devices which are connected in series between a first reference voltage terminal and second reference voltage terminal only when the probe needle electrically connects the two or more probe pads together. In other embodiments, the probe test circuit is formed with a first PMOS transistor having first and second current terminals that are coupled respectively to a first reference voltage terminal and a first probe pad, and a second NMOS transistor having first and second current terminals that are coupled respectively to a second probe pad and a second reference voltage terminal. In still further embodiments, the probe test circuit includes a PMOS transistor for receiving an analog input signal having a low DC level at a gate of the PMOS transistor and shifting the analog input signal up only when (a) a first probe needle electrically couples a probe pad at a source of the PMOS transistor to a first current source that is tied to a first reference voltage, and (b) a second probe needle electrically couples a probe pad at a drain of the PMOS transistor to a second reference voltage. In addition or in the alternative, the probe test circuit includes an NMOS transistor for receiving an analog input signal having a high DC level at a gate of the NMOS transistor and shifting the analog input signal down only when (a) a first probe needle electrically couples a probe pad at a source of the NMOS transistor to a first current source that is tied to a first reference voltage, and (b) a second probe needle electrically couples a probe pad at a drain of the PMOS transistor to a second reference voltage.

In another form, there is provided a method and system for testing an integrated circuit. In the disclosed methodology and system, an integrated circuit is provided that includes a device under test (e.g., a low power circuit) and a probe test circuit that is coupled to receive a signal from the device under test. The probe test circuit may be formed on a wafer so that it is inside or outside a region in which the integrated circuit is formed. In selected embodiments, the probe test circuit is formed on the integrated circuit with a plurality of switching devices which are connected in series between a first reference voltage and second reference voltage only when the probe needle electrically connects the two or more probe pads together. For example, the probe circuit may include a first PMOS transistor coupled between a first reference voltage a first probe pad, and a second NMOS transistor coupled between a second probe pad and a second reference voltage. The disclosed probe test circuit also includes two or more probe pads which are formed to be electrically separate from one another and which are used to convey the signal from the device under test to a probe needle only when the probe needle electrically connects the two or more probe pads. As will be appreciated, other conductive devices can also be used to electrically the probe pads, but the point is that the probe circuit is normally not operative because of the electrical isolation between the probe pads, and becomes operative when a probe needle is applied. The probe pads may be formed as first and second electrically-isolated, polygon-shaped or multi-pronged conductive pads which are formed proximately to one another so as to be electrically connected only when the probe needle is applied. In this way, a probe needle may be applied to electrically connect the two or more probe pads and thereby convey the signal from the device under test to the probe needle only when the probe needle electrically connects the two or more probe pads. As a result, the probe test circuit consumes no power except when the probe needle electrically connects the two or more probe pads. In selected embodiments, the probe needle is applied by applying a first probe needle to electrically couple a first current source to a first source probe pad of a PMOS transistor which is gated by an analog input signal having a first DC level, and also applying a second probe needle to electrically couple a first drain probe pad of the PMOS transistor to a first reference voltage, thereby shifting the analog input signal up only when the first and second probe needles are applied. In other embodiments, the probe needle is applied by applying a first probe needle to electrically couple a first current source to a first source probe pad of an NMOS transistor which is gated by an analog input signal having a first DC level, and applying a second probe needle to electrically couple a first drain probe pad of the NMOS transistor to a first reference voltage, thereby shifting the analog input signal down only when the first and second probe needles are applied.

In yet another form, there is provided a method and system for testing an integrated circuit. First, an integrated circuit is provided that includes a circuit under test, such as a low power circuit, which generates a first signal. The integrated circuit also includes a probe test circuit coupled to receive the first signal, where the probe test circuit comprises a PMOS transistor that is source-drain coupled between a first reference voltage a first probe pad, and a NMOS transistor that is source-drain coupled between a second reference voltage and a second probe pad that is formed to be electrically isolated from the first probe pad. As formed, the PMOS transistor and NMOS transistor are both gated by the first signal. By applying a probe needle to electrically connect the first and second probe pads, the first signal is conveyed for probe testing only when the probe needle electrically connects the first and second probe pads.

Although the described exemplary embodiments disclosed herein are directed to methods and systems for regulating a reference voltage by calibrating the voltage to remove voltage errors in the source voltage and/or cancelling offset voltages, the present invention is not necessarily limited to the example embodiments illustrate herein, and various embodiments of a voltage regulator circuit and methodology disclosed herein may be implemented with other circuit components. For example, a successive approximation register can be used to replace the programmable up/down counter. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit die comprising:
   functional circuitry;
   two or more probe pads for testing the functional circuitry which are electrically isolated from one another; and
   a probe test circuit connected to the functional circuitry for conveying a signal between the functional circuitry and a probe needle only when the probe needle electrically connects the two or more probe pads.

2. The integrated circuit die of claim 1, where the two or more probe pads comprise a first polygon-shaped pad and a second polygon shaped pad which are electrically isolated from one another.

3. The integrated circuit die of claim 1, where the two or more probe pads comprise a first multi-pronged pad and a second multi-pronged pad which are interleaved with one another and electrically isolated from one another.

4. The integrated circuit die of claim 1, where the probe test circuit comprises a plurality of switching devices which are connected in series between a first reference voltage terminal and second reference voltage terminal only when the probe needle electrically connects the two or more probe pads together.

5. The integrated circuit die of claim 1, where the probe test circuit comprises:
   a first PMOS transistor comprising first and second current terminals coupled, respectively, to a first reference voltage terminal and a first probe pad of the two or more probe pads; and
   a second NMOS transistor comprising first and second current terminals coupled, respectively, to a second probe pad of the two or more probe pads and a second reference voltage terminal.

6. The integrated circuit die of claim 1, where the probe test circuit consumes no power except when the probe needle electrically connects the two or more probe pads.

7. The integrated circuit die of claim 1, where the probe test circuit comprises a PMOS transistor for receiving an analog input signal having a DC level at a gate of the PMOS transistor and shifting the analog input signal up only when (a) a first probe needle electrically couples a probe pad at a source of the PMOS transistor to a first current source that is tied to a first reference voltage, and (b) a second probe needle electrically couples a probe pad at a drain of the PMOS transistor to a second reference voltage.

8. The integrated circuit die of claim 1, where the probe test circuit comprises an NMOS transistor for receiving an analog input signal having a DC level at a gate of the NMOS transistor and shifting the analog input signal down only when (a) a first probe needle electrically couples a probe pad at a source of the NMOS transistor to a first current source that is tied to a first reference voltage, and (b) a second probe needle electrically couples a probe pad at a drain of the PMOS transistor to a second reference voltage.

9. The integrated circuit die of claim 1, where the probe test circuit comprises:
   a PMOS transistor for receiving an analog input signal having a first DC level at a gate of the PMOS transistor and shifting the analog input signal up only when (a) a first probe needle electrically couples a probe pad at a source of the PMOS transistor to a first current source that is tied to a first reference voltage, and (b) a second probe needle electrically couples a probe pad at a drain of the PMOS transistor to a second reference voltage; and
   an NMOS transistor for receiving an analog input signal having a second DC level at a gate of the NMOS transistor and shifting the analog input signal down only when (a) a first probe needle electrically couples a probe pad at a source of the NMOS transistor to a first current source that is tied to a first reference voltage, and (b) a second probe needle electrically couples a probe pad at a drain of the PMOS transistor to a second reference voltage.

10. A method for testing an integrated circuit comprising a device under test and a probe test circuit coupled to receive a signal from the device under test, where the probe test circuit comprises two or more probe pads which are electrically separate from one another and which are used to convey the signal from the device under test to a probe only when the probe electrically connects the two or more probe pads, the method comprising:
   applying said probe to electrically connect the two or more probe pads and thereby convey the signal from the device under test to the probe only when the probe electrically connects the two or more probe pads.

11. The method of claim 10, wherein the probe test circuit is located on a wafer outside a region in which the integrated circuit is formed.

12. The method of claim 10, where the two or more probe pads on the integrated circuit comprise first and second electrically-isolated, polygon-shaped conductive pads which are proximate to one another so as to be electrically connected only when the probe is applied.

13. The method of claim 10, where providing the two or more probe pads on the integrated circuit comprise first and second electrically-isolated, multi-pronged conductive pads which are proximate to one another so as to be electrically connected only when the probe is applied.

14. The method of claim 10, where the probe test circuit on the integrated circuit comprises a plurality of switching devices which are connected in series between a first reference voltage terminal and second reference voltage terminal only when the probe electrically connects the two or more probe pads together.

15. The method of claim 10, where the probe test circuit on the integrated circuit comprises a first PMOS transistor coupled between a first reference voltage terminal and a first probe pad, and a second NMOS transistor coupled between a second probe pad and a second reference voltage terminal.

16. The method of claim 10, where the probe test circuit consumes no power except when the probe electrically connects the two or more probe pads.

17. The method of claim 10, where applying the probe comprises:
    applying a first probe needle to electrically couple a first current source to a first source probe pad of a PMOS transistor which is gated by an analog input signal having a first DC level; and
    applying a second probe needle to electrically couple a first drain probe pad of the PMOS transistor to a first reference voltage, thereby shifting the analog input signal up only when the first and second probe needles are applied.

18. The method of claim 10, where applying the probe comprises:
    applying a first probe needle to electrically couple a first current source to a first source probe pad of an NMOS transistor which is gated by an analog input signal having a first DC level; and
    applying a second probe needle to electrically couple a first drain probe pad of the NMOS transistor to a first reference voltage, thereby shifting the analog input signal down only when the first and second probe needles are applied.

19. The method of claim 10, where applying the probe comprises:
    applying a first probe needle to electrically couple a first current source to a first source probe pad of a PMOS transistor which is gated by a first analog input signal having a first DC level, and applying a second probe needle to electrically couple a first drain probe pad of the PMOS transistor to a first reference voltage, thereby shifting the first analog input signal up only when the first and second probe needles are applied; and
    applying a third probe needle to electrically couple a second current source to a first source probe pad of an NMOS transistor which is gated by a second analog input signal having a second DC level, and applying a fourth probe needle to electrically couple a first drain probe pad of the NMOS transistor to a second reference voltage, thereby shifting the second analog input signal down only when the third and fourth probe needles are applied.

20. A method for testing an integrated circuit comprising a device under test which generates a first signal, and a probe test circuit coupled to receive the first signal, where the probe test circuit comprises a PMOS transistor that is source-drain coupled between a first reference voltage a first probe pad, and a NMOS transistor that is source-drain coupled between a second reference voltage and a second probe pad that electrically isolated from the first probe pad, where the PMOS transistor and NMOS transistor are both gated by the first signal, the method comprising:
    applying a probe to electrically connect the first and second probe pads and thereby convey the first signal for probe testing only when the probe electrically connects the first and second probe pads.

* * * * *